(12) United States Patent
Arakawa

(10) Patent No.: US 7,648,920 B2
(45) Date of Patent: Jan. 19, 2010

(54) METHOD OF MANUFACTURING SEMICONDUCTOR DEVICE

(75) Inventor: Shinichi Arakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/858,516

(22) Filed: Sep. 20, 2007

(65) Prior Publication Data

US 2008/0081468 A1   Apr. 3, 2008

(30) Foreign Application Priority Data

Oct. 2, 2006   (JP)   ............................. 2006-270360

(51) Int. Cl.
*H01L 21/00* (2006.01)
(52) U.S. Cl. ..................... 438/754; 438/674; 438/637
(58) Field of Classification Search .................. 438/754, 438/674, 637
See application file for complete search history.

(56) References Cited

U.S. PATENT DOCUMENTS 7,309,658 B2 * 12/2007 Lazovsky et al. ........... 438/754
2005/0202350 A1 * 9/2005 Colburn et al. .............. 430/320
2006/0069171 A1 * 3/2006 Prokopowicz et al. ......... 521/61
2006/0108320 A1 * 5/2006 Lazovsky et al. ............. 216/2
2007/0026580 A1 * 2/2007 Fujii ......................... 438/149
2008/0038518 A1 * 2/2008 Gallagher et al. ........... 428/174
2008/0081468 A1 * 4/2008 Arakawa .................... 438/674
2008/0113178 A1 * 5/2008 Lazovsky et al. ........ 428/304.4
2008/0305197 A1 * 12/2008 Colburn et al. ............... 425/90

OTHER PUBLICATIONS

S. Arakawa et al.; Breakthrough Integration of 32nm-node Cu/Ultra Low-k SiOC (k=2.0) Interconnects byusing Advanced Pore-Sealing and Low-k Hard Mask Technologies; 2004 Symposium on VLSI Technology Digest of Technical Papers p. 60-61.
M. Ueki et al.; Highly Reliable, 65 um-node Cu Dual Damascene Interconnects with Full Porous-SiOCH (k-2.5) Films for Low-Power ASICs; 2006 IEEE; p. 210-212.

* cited by examiner

*Primary Examiner*—Laura M Menz
(74) *Attorney, Agent, or Firm*—Sonnenschein Nath & Rosenthal LLP

(57) ABSTRACT

A method of manufacturing a semiconductor device includes the steps of: forming recesses (a via hole and wiring grooves) in a insulation film; forming a seal layer on inside surfaces of the recesses by using a gas based on a silane having an alkyl group as a precursor; applying EB-cure or UV-cure to the seal layer; and filling up the recesses with a conductor.

3 Claims, 12 Drawing Sheets

PRIOR ART

METHOD OF MANUFACTURING SEMICONDUCTOR DEVICE

CROSS REFERENCES TO RELATED APPLICATIONS

The present invention contains subject matter related to Japanese Patent Application JP 2006-270360 filed in the Japan Patent Office on Oct. 2, 2006, the entire contents of which being incorporated herein by reference.

BACKGROUND OF THE INVENTION

1. Field of the Invention

The present invention relates to a method of manufacturing a semiconductor device by forming a groove wiring in a low-permittivity (low-k) film.

2. Description of the Related Art

In recent years, attendant on the tendency toward semiconductor devices higher in the degree of integration and minuter in size, a reduction in RC delay has come to be needed especially. In view of this, it has been proposed to use copper (Cu) having a low specific resistance as a wiring material, in place of aluminum (Al) used conventionally, and to use a low-permittivity (low-k) film with a low permittivity as an insulating material. As to low-permittivity (low-k) insulating films, development of insulating films with a relative permittivity k<3.0 has been under way, and examples of such insulating films include hydrogen silsesquioxane (HSQ), methyl silsesquioxane (MSQ), and aromatic compound-containing organic insulating film. Hereinafter, the low-permittivity film means an insulating film with a relative permittivity k<3.0.

In recent years, in the wiring structures in which grooves formed in an insulating film are filled up with a wiring material to form wirings (for example, dual Damascene structure), a hybrid structure obtained by combining an aromatic compound-containing insulating film easy to process with polymethylsilsesquioxane (MSQ) has been widely used. In consideration of the 45 nm or 32 nm generation as a design rule, the use of a low-permittivity film with a permittivity of not more than 2.5 as a insulation film to be provided with vias has been proposed. In general, a low-permittivity film is susceptible to plasma damages at the time of processing thereof, and, as a result, tends to be hygroscopic. In addition, since the low-permittivity film often has pores formed therein for reducing the permittivity, and the presence of the pores accelerates absorption of moisture. Where the low-k film is thereafter subjected to a wetting treatment, the pores may form paths through which a chemical liquid penetrates. Besides, the pores may permit a metal to ooze out into the insulation film.

Where absorption of moisture into the insulation film has occurred, corrosion (e.g., oxidation) of the barrier metal film is caused upon degassing, resulting in oozing out of the metal into the insulation film or an increase in the via resistance due to deterioration of the barrier property. In addition, the adhesion between the insulation film and the copper seed layer is also deteriorated, generating such fatal defects as electromigration and stress migration arising from the vias.

As a countermeasure against the plasma damages to the low-permittivity film, development of a pore-sealing technology has been being made (refer to Non-Patent Document 1 (M. Ueki, M. Narihiro, H. Ohtake, M. Tagami, M. Tada, F. Ito, Y. Harada, M. Abe, N. Inoue, K. Arai, T. Takeuchi, S. Saito, T. Onodera, N. Furutake, M. Hiroi, M. Sekine and Y. Hayashi, "Highly Reliable 65 nm-mode Cu Dual Damascene Interconnects with Full Porous-SiOCH (k=2.5) Films for Low-Power ASICs", 2004 Symposium on VLSI Technology Digest of Technical Papers p60-61, 2004.)).

In the technology disclosed in Non-patent Document 1, after a low-permittivity film is processed, a sealing material film is built up for the purpose of sealing. In this case, etch-back should be conducted for securing conductivity at the bottom parts of the vias. This makes it possible to secure conductivity at the bottoms of the vias and to leave the sealing material film in the form of spacers in the trenches and on side wall parts of the vias. However, this process has the problem that the bottom parts of the vias cannot be sealed, and the problem that the bottom parts of the vias undergo etching damages during the spacer forming process, resulting in a rise in the interlayer capacity (refer to Non-patent Document 2 (S. Arakawa, I. Mizuno, Y. Ohoka, K. Nagahata, K. Tabuchi, R. Kanamura and S. Kadomura, "Breakthrough Integration of 32 nm-mode Cu/Ultra Low-k SiOC (k=2.0) Interconnects by using Advanced Pore-Sealing and Low-k Hard Mask Technologies", 2006 IEEE p210-212, 2004.)). These problems become more conspicuous as the lowering in the permittivity of the insulation film is accelerated.

In order to solve the above problems, elimination of the etch-back step may be contemplated as a method for attaining the object. It is considered that via conduction can be secured to a certain extent by reducing the deposited film thickness to a level of several nanometers. In this case, however, the coverage of the side wall parts would be insufficient, and the sealing effect would be deficient, resulting in deteriorated reliability.

An example of the method of manufacturing a wiring structure by use of a low-permittivity film in the related art will be described below, referring to manufacturing step sectional views shown in FIGS. 6A to 6I.

As shown in FIG. 6A, a wiring groove 251 is formed in an insulating film (not shown) formed on a semiconductor substrate (not shown), and a wiring 253 is formed inside the wiring groove 251, with a barrier metal layer 252 therebetween. For example, the wiring 253 is formed from copper (Cu) in a thickness of 60 nm. Next, a barrier layer 254 covering the wiring 253 is formed. The barrier layer 254 is composed of a silicon carbonitride (SiCN) film formed by a chemical vapor deposition (e.g., PE-CVD: plasma enhancement CVD) method, and is formed in a thickness of 30 nm. Subsequently, a insulation film 211 is formed. The insulation film 211 is composed, for example, of an MSQ (methyl-hydrogen-silsesquioxane)-based porous film having a permittivity of not more than 2.5, the thickness being 250 nm. The insulation film 211 may be formed by a CVD method or by an SOG coating method. In addition, the material of the wiring 253 is not limited to copper but may be other metal such as silver (Ag), gold (Au) and aluminum (Al).

Next, as shown in FIG. 6B, an etching mask 231 for forming a via is formed on the insulation film 211 by use of a chemical amplification type ArF resist. The diameter of a via pattern 232 formed in the etching mask 231 was 60 nm.

Subsequently, as shown in FIG. 6C, by dry etching conducted using the etching mask 231 [see FIG. 6B], a via hole 213 is formed in the insulation film 211. In the dry etching, a carbon fluoride ($CF_x$)-based gas was used as the etching gas. Thereafter, the etching mask 231 is removed by ashing with an oxygen ($O_2$)-based gas. This etching treatment is carried out at a low pressure so as to minimize the plasma damages to the insulation film 211, which is a low-permittivity (low-k) film. In this case, the gas pressure was set to 0.27 Pa, and is desirably not more than 0.67 Pa.

Next, as shown in FIG. 6D, an etching mask 233 for forming wiring grooves is formed on the insulation film 211 by use of a chemical amplification type ArF resist. The width of wiring groove patterns 234 formed in the etching mask 231 was 60 nm.

Subsequently, as shown in FIG. 6E, by dry etching conducted using the etching mask 233 [see FIG. 6D], wiring grooves 214 are formed in a depth of 140 nm in the insulation film 211. In this dry etching, a carbon fluoride (CF)-based gas was used as the etching gas. Thereafter, the etching mask 233 is removed by ashing with an oxygen ($O_2$)-based gas. This treatment is carried out at a low etching atmosphere pressure so as to minimize plasma damages to the low-permittivity (low-k) film. The pressure of the etching atmosphere was set to 0.27 Pa.

Next, as shown in FIG. 6F, the barrier layer 254 at a bottom part of the via hole 213 is removed, to expose the wiring 253 there. The etching for this removal is conducted using a carbon fluoride (CF)-based gas. Further, the surface of the wiring 253 thus exposed is washed with an organic cleaning liquid.

Subsequently, as shown in FIG. 6G, a seal layer 215 having a thickness of 1 nm or below is formed on inside surfaces of the via hole 213 and the wiring grooves 214 by using dimethylphenylsilane (DMPS) as a precursor. This treatment was carried out under the conditions of a substrate RF bias power of 150 W, a film forming atmosphere pressure of 0.67 kPa, a flow rate of DMPS as precursor of 500 $cm^3$/min, a flow rate of helium (He) as carrier gas of 1000 $cm^3$/min, and a substrate temperature of 350° C., but these conditions are not limitative.

Next, as shown in FIG. 6H, a tantalum (Ta) film having a thickness of 7 nm is formed as a barrier layer 216 on the surface of the insulation film 211 inclusive of the inside surfaces of the via hole 213 and the wiring grooves 214, with the seal layer 215 therebetween, by a sputtering method. Further, a copper seed layer (not shown) is formed in a thickness of 45 nm. Subsequently, the inside of the via hole 213 and the wiring grooves 214 is filled up with a copper (Cu) film 217 by an electrochemical plating (ECP) method or a CVD method. Next, an annealing treatment for grain growth is conducted at 250° C. for 90 sec. Subsequently, the surplus copper (Cu) film 217 (inclusive of the copper seed layer) on the insulation film 211 is polished away by a chemical mechanical polishing (CMP) method, to complete copper wirings 218 in which the via hole 213 and the wiring grooves 214 are filled up with the copper film 217, with the barrier film 216 therebetween, and which are connected to the wiring 253 through the via hole 213.

After the dual Damascene process as above-mentioned, the insulation film 211 which is a low-permittivity film has received much plasma damages, the surface layer damaged part has absorbed moisture, and absorption of moisture into the film through pores has progressed.

In the case where the thickness of the seal layer 215 is 1 nm, the resistance (mean value) is raised by 50%, and the dispersion of resistance is also increased by a factor of 3 or more, as compared with the case where the sealing treatment is not conducted. This is not permissible on a device design basis. Besides, in the case where the thickness of the seal layer 215 is 0.5 nm, defects are generated upon the subsequent test of reliability (stress migration, electro-migration). This is considered to show that the small thickness of the seal layer 215 made the sealing effect insufficient, so that film quality deterioration (oxidation) of the barrier metal proceeded due to degassing from the inside of the film, oozing-out of copper (Cu) is observed, and, as shown in FIG. 6I, the adhesion between the copper (Cu) seed layer and the insulation film was deteriorated, resulting in the defect composed of formation of a void 219 inside the via hole 213.

SUMMARY OF THE INVENTION

Accordingly, in the case where a low-permittivity (low-k) film is used as a insulation film and where a seal layer is formed for the purpose of restraining plasma damages from being generated in the insulation film, defects in reliability due to stress migration, electro-migration or the like would be generated if the seal layer is formed to be thin so as to suppress the rise in contact resistance at the via part.

Thus, there is a need to reduce the defects in reliability, without causing an increase in via resistance, by using a seal layer for restraining influences of plasma damages.

According to a first embodiment of the present invention, there is provided a method of manufacturing a semiconductor device, including the steps of: forming a recess in a insulation film; forming a seal layer on inside surfaces of the recess by using a gas based on a silane having an alkyl group as a precursor; applying EB-cure or UV-cure to the seal layer; and filling up the recess with a conductor.

According to the first embodiment of the present invention, the EB-cure or UV-cure is applied to the seal layer, so that the number of silicon-oxygen-silicon (Si—O—Si) linkage components is increased as compared with the crosslinking reaction, and the adhesion between the seal layer and the insulation film is enhanced even if the insulation film is a low-permittivity (low-k) film. In addition, recovery of silicon (Si) dangling bonds in the insulation film by carbon (alkyl groups) is accelerated. Furthermore, enhancement of denseness of the film is accelerated by recombination.

According to the first embodiment of the present invention, enhancement of denseness of the seal layer, improvement of the adhesion, and recovery of the damaged layers in the low-permittivity (low-k) film are realized, so that the sealing performance of the seal layer can be enhanced. Therefore, even in the case where the seal layer is formed to have an extremely small thickness (for example, 0.5 nm or below) such that the rise in resistance at the bottom part of a via will not matter, deterioration of film quality of the barrier layer formed in a recess in a insulation film due to oozing-out of moisture from the inside of the insulation film is restrained. In addition, oozing-out of metal into the insulation film, a rise in the resistance at the via, and such defects as stress migration and electro-migration arising from the via can be obviated, whereby enhanced reliability is promised.

DETAILED DESCRIPTION OF THE PREFERRED EMBODIMENTS

Now, a first embodiment of the method of manufacturing a semiconductor device in the present invention will be described below, referring to manufacturing step sectional views shown in FIGS. 1A to 1F.

Figure 1A:
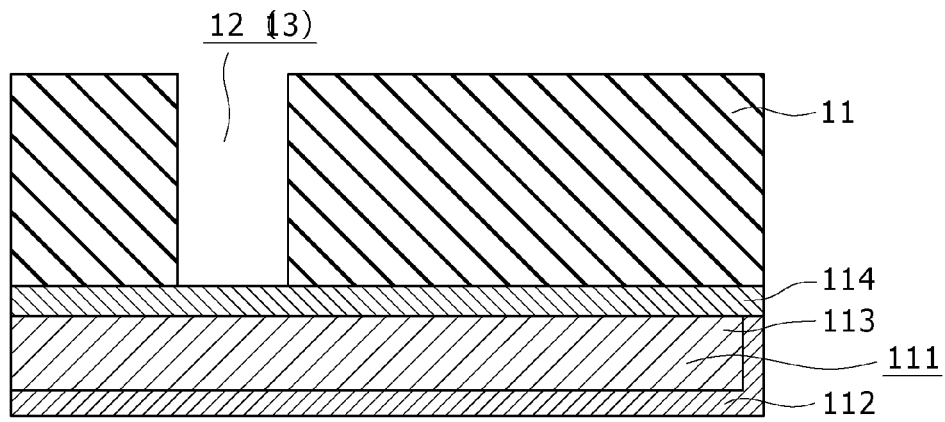
FIGS. 1A to 1C are manufacturing step sectional views illustrating a first embodiment of a method of manufacturing a semiconductor device in the present invention.

As shown in FIG. 1A, a wiring groove 111 is formed in an insulating film (not shown) formed on a semiconductor substrate (not shown), and a wiring 113 is formed in the inside of the wiring groove 111, with a barrier metal layer 112 therebetween. The wiring 113 is formed from copper in a thickness of 60 nm. Next, a barrier layer 114 covering the wiring 113 is formed. The barrier layer 114 includes a silicon carbonitride (SiCN) film formed by a chemical vapor deposition (e.g., PE-CVD (plasma enhancement CVD)) method, and is formed in a thickness of 30 nm. Next, a insulation film 11 including a silicon oxide insulating film is formed on the barrier layer 114. The barrier layer 114 includes, for example, an MSQ (methyl-hydrogen-silosesquioxane) porous film having a permittivity of not more than 2.5, and is formed in a thickness of 250 nm, for example. The film forming method in this case may be a CVD method or may be an SOG coating method. In addition, the wiring 113 may be formed not by use of copper but by use of such a metal as silver (Ag), gold (Au) and aluminum (Al).

Subsequently, an etching mask (not shown) for forming a via is formed on the insulation film 11 by using, for example, a chemical amplification type ArF resist. The diameter of a via pattern formed in the etching mask was 60 nm, for example.

Next, a recess 12 (e.g., a via hole 13) is formed in the insulation film 11 by dry etching conducted by use of the etching mask. In the dry etching, a carbon fluoride (CF) based gas was used as an etching gas. Thereafter, the etching mask is removed by ashing conducted by an oxygen ($O_2$) based gas. In this case, in order to minimize plasma damages to the low-permittivity (low-k) film, the process is carried out in an etching atmosphere at a low pressure. The pressure of the etching atmosphere in this case was set to 0.27 Pa. The pressure of the etching atmosphere is desirably not more than 0.67 Pa.

Figure 1B:
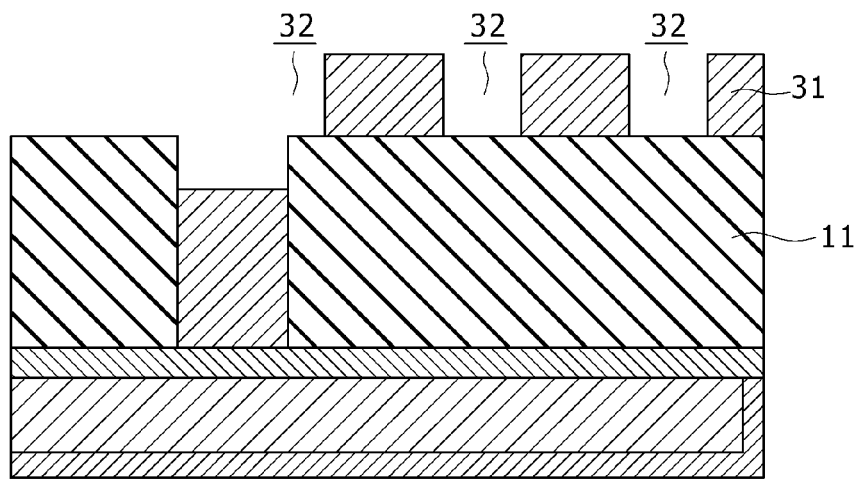

Subsequently, as shown in FIG. 1B, an etching mask 31 for forming wiring grooves is formed on the insulation film 11 by using, for example, a chemical amplification type ArF resist. The width of the wiring pattern 32 formed in the etching mask 31 was set to 60 nm, for example.

Figure 1C:
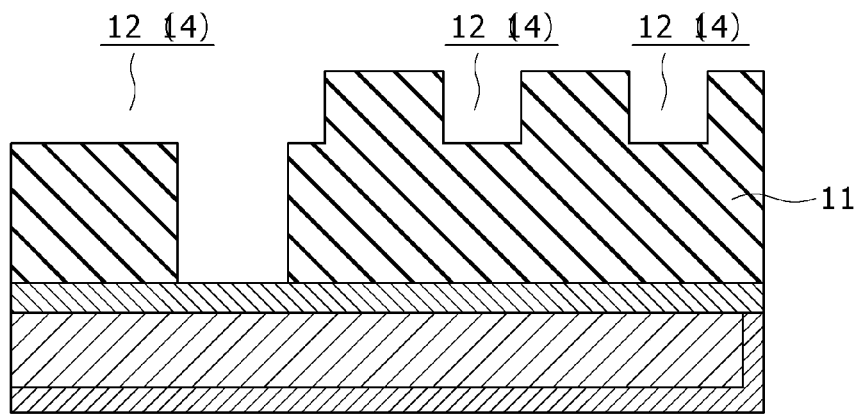

Next, as shown in FIG. 1C, dry etching is conducted using the etching mask 31 (see FIG. 1B), whereby the recess 12 (e.g., wiring grooves 14) is formed in the insulation film 11 in a depth of 140 nm, for example. In the dry etching, for example, a carbon fluoride (CF) based gas was used as an etching gas. Thereafter, the etching mask 31 is removed by ashing conducted using an oxygen ($O_2$) based gas, for example. In this case, in order to minimize plasma damages to the low-permittivity (low-k) film, the process is conducted in an etching atmosphere at a low pressure. The pressure of the etching atmosphere in this case was set to 0.27 Pa. The pressure of the etching atmosphere is desirably not more than 0.67 Pa.

Figure 1D:
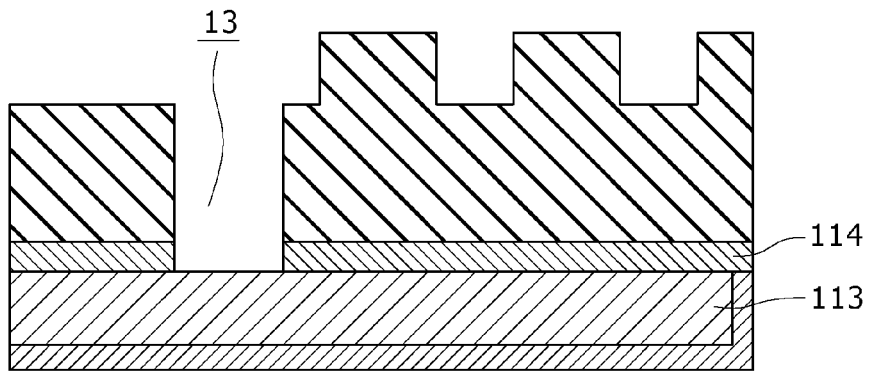
FIGS. 1D to 1F are manufacturing step sectional views illustrating the first embodiment of the method of manufacturing a semiconductor device in the present invention.

Subsequently, as shown in FIG. 1D, the barrier layer 114 at the bottom part of the via hole 13 is removed, to expose the wiring 113. The removing process in this case is conducted by use of dry etching, for example. The dry etching is carried out by using a carbon fluoride (CF) based gas, for example. Furthermore, the surface of the wiring 113 thus exposed is washed with an organic cleaning liquid.

Figure 1E:
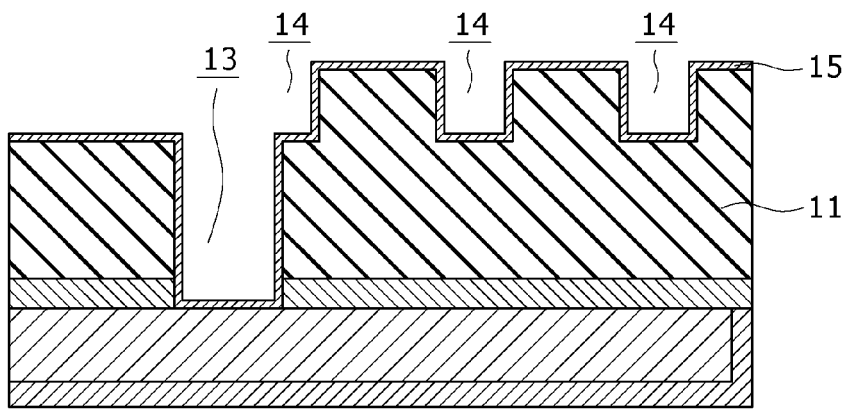

Next, as shown in FIG. 1E, a seal layer 15 composed, for example, of a silicon carbide (SiC) film in a thickness of, for example, 0.5 nm is formed on the insulation film 11 inclusive of the inside surfaces of the via hole 13 and the wiring grooves 14, by using dimethylphenylsilane (DMPS) as a precursor. The DMPS has a comparatively high molecular weight and a three-dimensional structure. Therefore, the DMPS is comparatively high in controllability of the low deposition rate, which is indispensable to formation of an extremely thin film, so that the DMPS is suited to formation of an extremely thin film of about 0.5 nm in thickness. The film forming conditions used in this case are a substrate RF bias power of 150 W, a film forming atmosphere pressure of 0.67 kPa, a flow rate of DMPS as precursor species of 500 $cm^3$/min, a flow rate of helium (He) as carrier gas of 1000 $cm^3$/min, and a substrate temperature of 350° C., which are non-limitative examples. The thickness of the seal layer 15 is at such a level that etching damages generated in the insulation film 11 can be compensated for and that the rise in via resistance due to the seal layer 15 does not matter. For example, the thickness of the seal layer 15 is desirably not more than 0.5 nm.

Further, electron beam curing (EB-Cure) is carried out. In this case, irradiation with electron beams was carried out for 5 min under the conditions of a treating atmosphere pressure of 0.93 kPa, a current of 1 mA, and an acceleration voltage of 10 keV, but these conditions are not limitative. By this treatment, the seal layer 15 was made denser, the adhesion between the seal layer 15 and the insulation film 11 was improved, and recovery of the damaged layer (not shown) generated in the insulation film 11 which is a low-k film was accelerated. Alternatively, ultraviolet ray curing (UV-Cure) may be carried out, whereby the same effects as those of the EB-cure can be obtained. In the case of the UV-cure, irradiation with UV rays having a wavelength of 150 to 380 nm was carried out under the conditions of a substrate temperature of 350° C., an irradiation atmosphere being an inactive atmosphere such as a vacuum atmosphere, an argon (Ar) atmosphere, a helium (He) atmosphere, a nitrogen ($N_2$) atmosphere, etc., an irradiation atmosphere pressure of 0.67 kPa, and an irradiation time of 10 min.

Figure 1F:
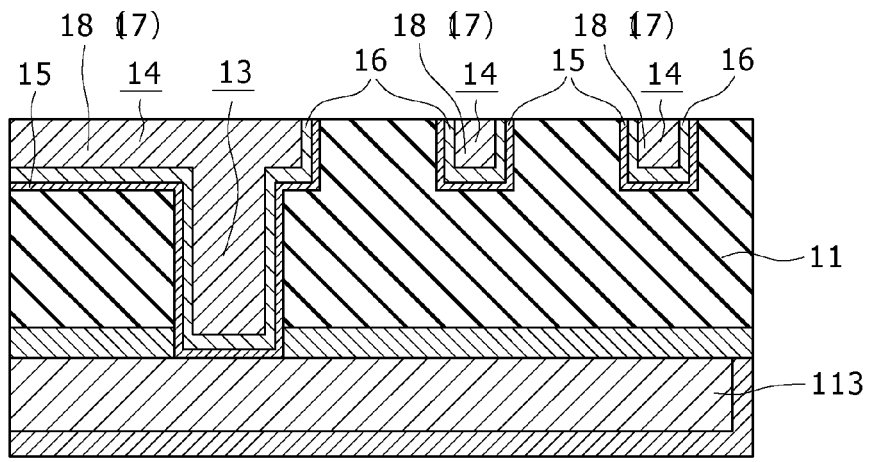

Subsequently, as shown in FIG. 1F, a tantalum (Ta) film as the barrier layer 16 was formed in a thickness of 7 nm on the surface of the insulation film 11 inclusive of the inside surfaces of the via hole 13 and the wiring grooves 14 by a sputtering method. Further, a copper seed layer (not shown) is formed in a thickness of 45 nm. Subsequently, the inside of the via hole 13 and the wiring grooves 14 is filled up with the conductor 17, for example, a copper (Cu) film, by an electrochemical plating (ECP) method or a CVD method. Next, an annealing treatment for the purpose of grain growth is conducted at 250° C. for 90 sec. Subsequently, the surplus copper (Cu) film 17 (inclusive of the copper seed layer) on the insulation film 11 is polished away by a chemical mechanical polishing (CMP) method, whereby the inside of the via hole 13 and the wiring grooves 14 is filled up with the copper film 17, with the seal layer 15 and the barrier film 16 therebetween, and the copper wirings 18 connected to the wiring 113 through the via hole 13 are completed.

As the precursor used in forming the seal layer 15, a gas based on a silane having an alkyl group is preferably used, examples of which include not only the above-mentioned dimethylphenylsilane (DMPS) but also trimethylsilane (3MS), tetramethylsilane (4MS), hexamethyldisilane (HMDS), octamethylcyclotetrasiloxane (OMCTS), tetramethylcyclotetrasiloxane (TMCTS), diethoxymethylsilane (DEMS), and dimethyldimethoxysilane (DMDMOS).

Besides, a carbon-based gas such as methane ($CH_4$) and ethylene ($C_2H_4$) may be added to the alkylsilane-based gas. When the carbon-based gas is thus added, recovery of dangling bonds is accelerated by carbon or carbon-containing groups (e.g., alkyl groups).

Figure 2:
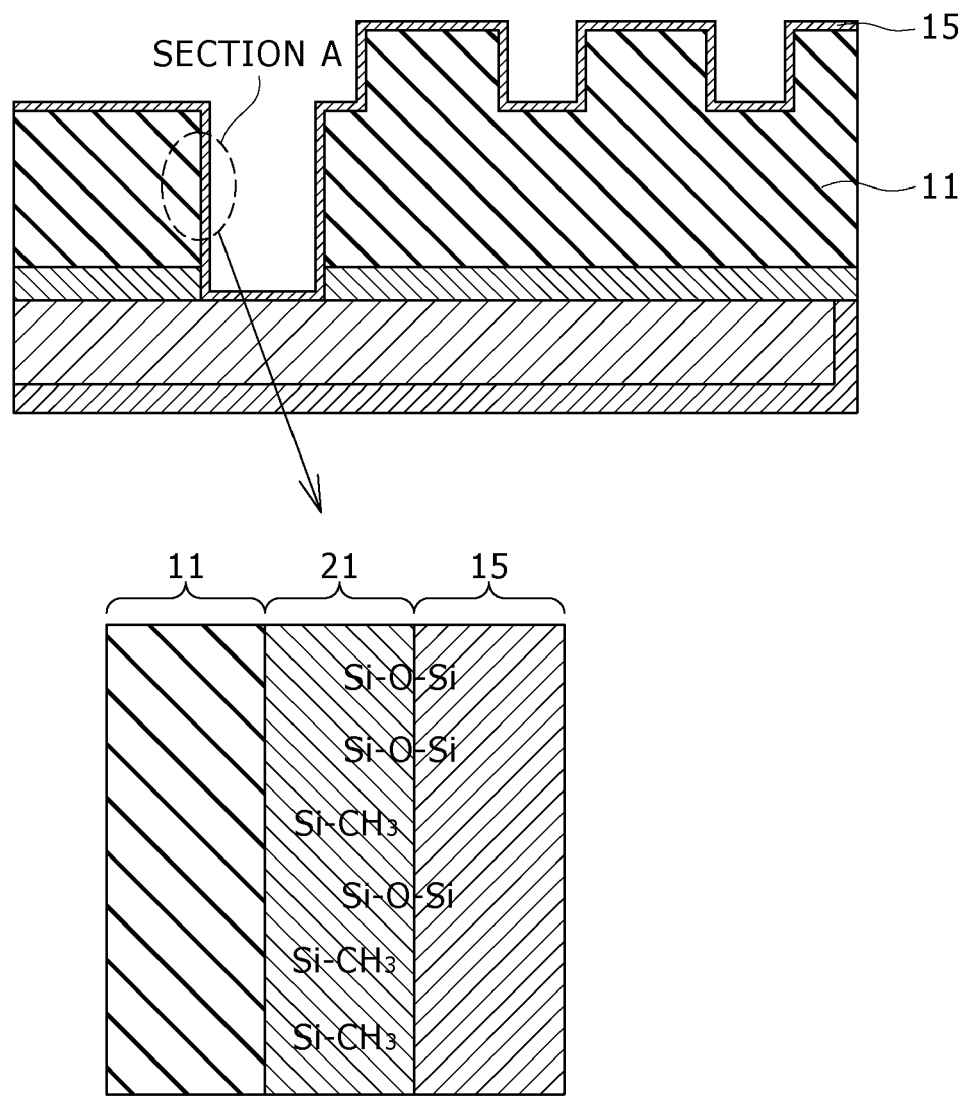
FIG. 2 is a general configuration sectional view for illustrating the effects of the first embodiment.

In the manufacturing method according to the first embodiment above, as shown in FIG. 2, the seal layer 15 is subjected to the EB-cure or UV-cure, so that silicon-oxygen-silicon (Si—O—Si) linkage components are increased as compared with the crosslinking reaction, and the adhesion between the seal layer 15 and the insulation film 11 is enhanced, even where the insulation film 11 is a low-k film. In addition, recovery of the silicon (Si) dangling bonds in the insulation film 11 by carbon or alkyl groups (methyl group is shown as an example in the figure) is accelerated. Further, enhancement of denseness of the film is accelerated by recombination.

Thus, enhancement of denseness of the seal layer 15, improvement in adhesion between the seal layer 15 and the insulation film 11, and recovery of the damaged layer 21 generated in the insulation film 11 are realized, so that the sealing performance of the seal layer 15 can be enhanced. Therefore, even where the seal layer 15 is formed as an extremely thin film, for example a 0.5 nm-thick film, such that the rise in resistance at the bottom part of the via hole 13 will not matter, film quality deterioration (e.g., oxidation) of the barrier layer 16 formed inside the recess (via hole 13) in the insulation film 11 due to oozing of moisture present in the insulation film is suppressed; in addition, oozing of copper used as the wiring material into the insulation film 11 and via defects (e.g., such defects as stress migration and electromigration) arising from, for example, deterioration of the adhesion between the copper seed layer and the insulation film 11 due to the via can be obviated, so that an enhanced reliability can be contrived. Besides, the via resistance is comparable to that in the case where the seal layer is not used, since it is made possible, by the enhanced density of the seal layer 15, to use the extremely thin seal layer 15 with a thickness of 0.5 nm or below. Further, any deterioration in wiring-to-wiring capacity or yield in relation to via formation was not observed. Accordingly, the via resistance can be reduced, while maintaining the sealing performance of the seal layer 15.

Figure 3A:
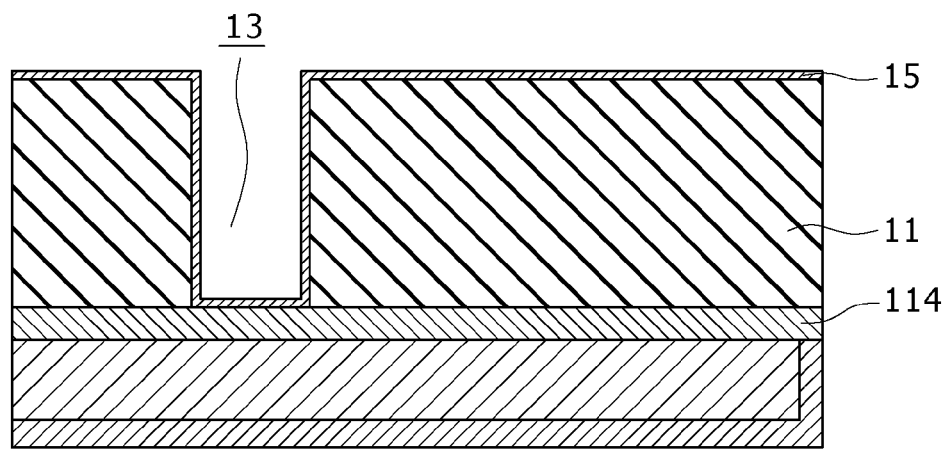
FIG. 3A is a manufacturing step sectional view illustrating a modified example of the first embodiment;.
Figure 3B:
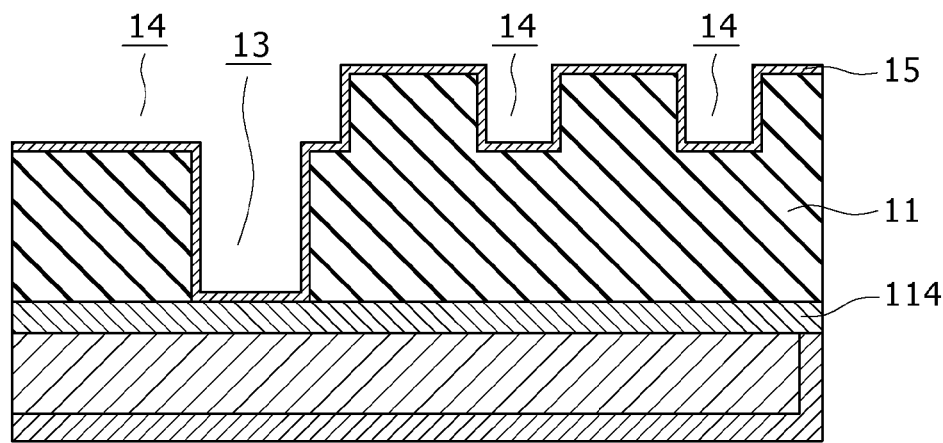
FIG. 3B is a manufacturing step sectional view illustrating a modified example of the first embodiment.

Besides, in the manufacturing method according to the first embodiment above, the step of forming the seal layer 15 and the step of performing the EB-cure or UV-cure can also be conducted immediately after the formation of the via hole 13, as illustrated in FIG. 3B. In this case, the seal layer 15 is formed on the inside surfaces of the via hole 13 and on the surface of the insulation film 11. The conditions for forming the seal layer 15 are the same as the above-mentioned conditions. Thereafter, the EB-cure or UV-cure is conducted.

In addition, the steps described referring to FIG. 3B can be incorporated into the manufacturing method according to the first embodiment above. When the steps of forming the seal layer 15 and performing the EB-cure or UV-cure immediately after the formation of the via hole 13 and the steps of forming the seal layer 15 and performing the EB-cure or UV-cure immediately after the removal of the barrier layer 114 from the inside of the via hole 13 are thus carried out in combination, the improving effect is further enhanced.

Besides, in the manufacturing method according to the first embodiment above, the steps of forming the seal layer 15 and performing the EB-cure or UV-cure can be conducted immediately before the removal of the barrier layer 114 from the inside of the via hole 13, as illustrated in FIG. 3B. In this case, the seal layer 15 is formed on the inside surfaces of the via hole 13 and the wiring grooves 14 and on the surface of the insulation film 11. The conditions for forming the seal layer 15 are the same as the above-mentioned conditions. Thereafter, the EB-cure or UV-cure is performed.

In addition, the steps described referring to FIG. 3B can be incorporated into the manufacturing method according to the first embodiment above. When the steps of forming the seal layer 15 and performing the EB-cure or UV-cure immediately before the removal of the barrier layer 114 from the inside of the via hole 13 and the steps of forming the seal layer 15 and performing the EB-cure or UV-cure immediately after the removal of the barrier layer 114 from the inside of the via hole 13 are thus carried out in combination, the improving effect is further enhanced.

The steps of forming the seal layer 15 and performing the EB-cure or UV-cure may be conducted once or a plurality of times, immediately after the formation of the via hole 13, immediately before the removal of the barrier layer 114 from the inside of the via hole, or immediately after the removal of the barrier layer 114 from the inside of the via hole 13. In this case, the total film thickness of the seal layer 15 at the bottom part of the via hole 13 is desirably, for example, not more than 0.5 nm, so as to suppress the rise in the via resistance due to the increase in the total film thickness.

Now, a second embodiment of the method of manufacturing a semiconductor device in the present invention will be described below, referring to manufacturing step sectional views shown in FIGS. 4A to 4H. The second embodiment described below illustrates the application of the manufacturing method in the present invention to a so-called hybrid insulation film structure in which an organic insulating film is used for portions, where to form the wirings, of the insulation film and an inorganic insulating film is used for the portion, where to form the via, of the insulation film.

Figure 4A:
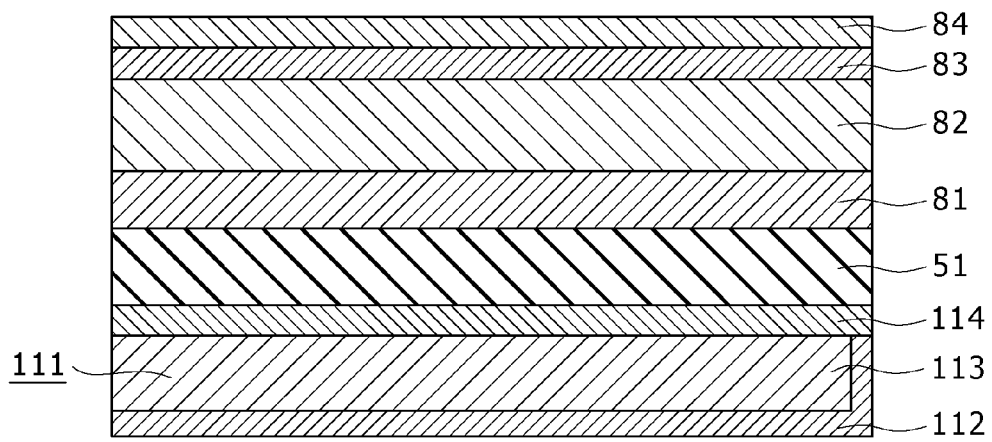
FIGS. 4A and 4B are manufacturing step sectional views illustrating a second embodiment of the method of manufacturing a semiconductor device in the present invention.

As shown in FIG. 4A, in the same manner as in the first embodiment above, a wiring groove 111 is formed in an insulating film (not shown) formed on a semiconductor substrate (not shown), and a wiring 113 is formed inside the wiring groove 111, with a barrier metal layer 112 therebetween. The wiring 113 is formed from copper in a thickness of 60 nm. Next, a barrier insulating film 114 covering the wiring 113 is formed. The barrier insulating film 114 is composed of a silicon carbonitride (SiCN) film formed by a chemical vapor deposition (e.g., PE-CVD (plasma enhancement CVD)) method, and is formed in a thickness of 30 nm. Subsequently, a first insulation film 51 comprised of a silicon oxide based insulating film is formed on the barrier insulating film 114. The first insulation film 51 is composed, for example, of an MSQ (methyl-hydrogen-silsesquioxane) based porous film having a permittivity of not more than 2.5, and is formed in a thickness of 100 nm. This film may be formed by a CVD method or by an SOC coating method. In addition, examples of the material which can be used for forming the wiring 113 include not only copper but also such metals as silver (Ag), gold (Au) and aluminum (Al).

Further, a second insulation film in the form of a laminate film composed of an organic insulating film 81 and an inorganic insulating film 82 is formed on the first insulation film 51. The organic insulating film 81 is composed, for example, of a polyaryl ether film in a thickness of, for example, 80 nm. Subsequently, the inorganic insulating film 82 is formed on the organic insulating film 81. The inorganic insulating film 82 is, for example, a silicon oxide film formed by a plasma enhancement CVD method, and is formed in a thickness of, for example, 100 nm. Next, a first hard mask 83 and a second hard mask 84 are sequentially formed over the inorganic insulating film 82. The first hard mask 83 and the second hard mask 84 are each formed in a thickness of 50 nm.

Figure 4B:
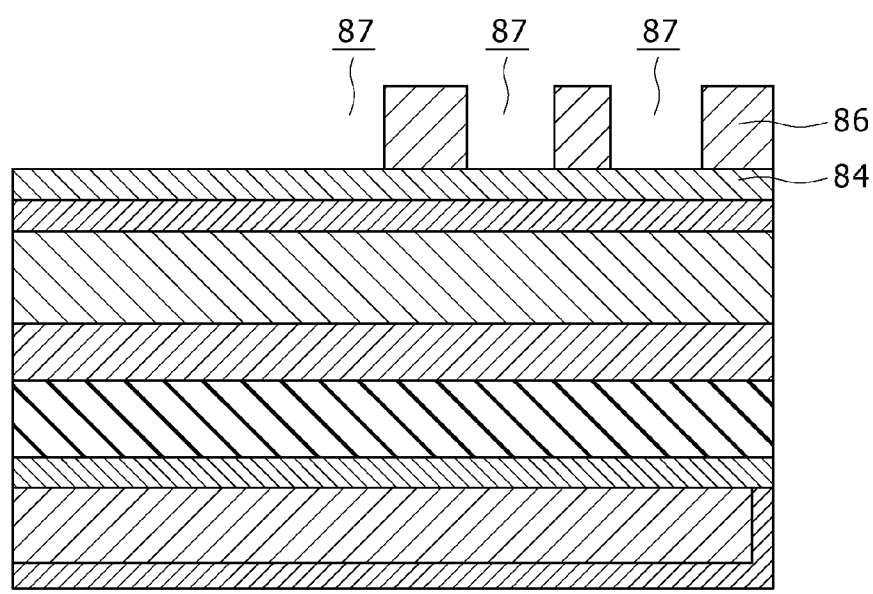

Subsequently, as shown in FIG. 4B, an etching mask 86 for forming a wiring groove pattern is formed on the second hard mask 84 by using, for example, a chemical amplification type ArF resist. A wiring groove pattern 87 is formed in the etching mask 86. Incidentally, though not shown, an organic anti-reflective film (BARC: bottom anti-reflective coat) may be formed on the lower side of the etching mask 86 by coating.

Figure 4C:
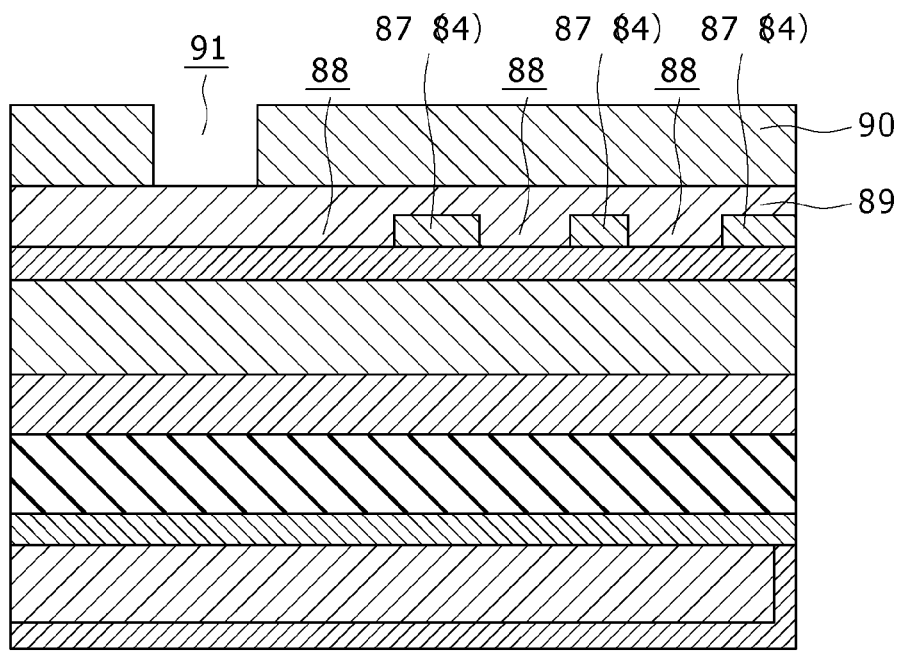
FIGS. 4C and 4D are manufacturing step sectional views illustrating the second embodiment of the method of manufacturing a semiconductor device in the present invention.

Next, as shown in FIG. 4C, the second hard mask 84 is processed by use of the etching mask 86 (see FIG. 4B), to form a wiring groove pattern 88 as extensions of the wiring groove pattern 87 (see FIG. 4B). Thereafter, the etching mask 86 and the BARC left upon the etching step are exfoliated by using, for example, an oxygen ($O_2$) based gas.

Subsequently, an organic anti-reflective film (BARC: bottom anti-reflective coat) 89 is formed on the first hard mask 83 by coating so as to fill up the wiring groove pattern 88, and then an etching mask 90 for forming a via is formed by using, for example, a chemical amplification type ArF resist. A via pattern 91 is formed in the etching mask 90. The diameter of the via pattern 91 was set to 60 nm, for example.

Figure 4D:
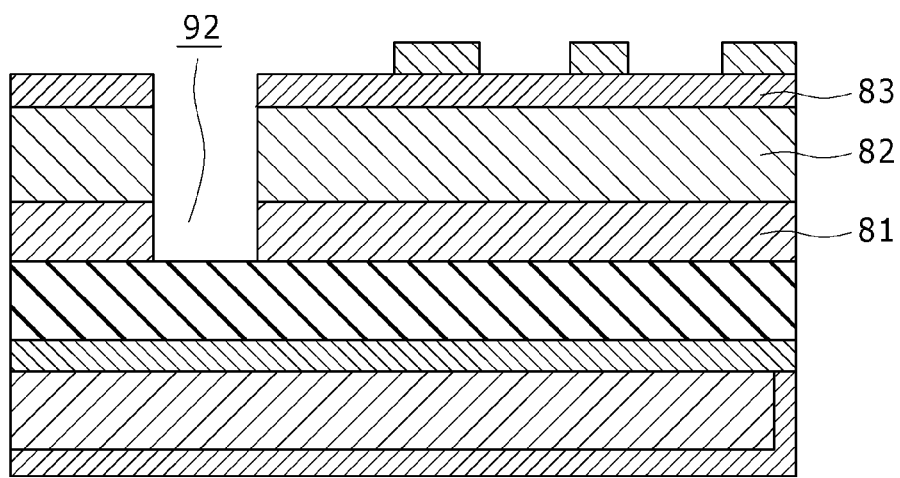

Next, as shown in FIG. 4D, the first hard mask 83, the inorganic insulating film 82, and the organic insulating film 81 are sequentially etched, to form a via hole 92. In this etching process, the etching mask 90 and the organic anti-reflective film 89 [see FIG. 4C] are also etched away during etching of the organic insulating film 81. In this etching, for example, a mixed gas of nitrogen ($N_2$) and oxygen ($O_2$) is used as the etching gas.

Figure 4E:
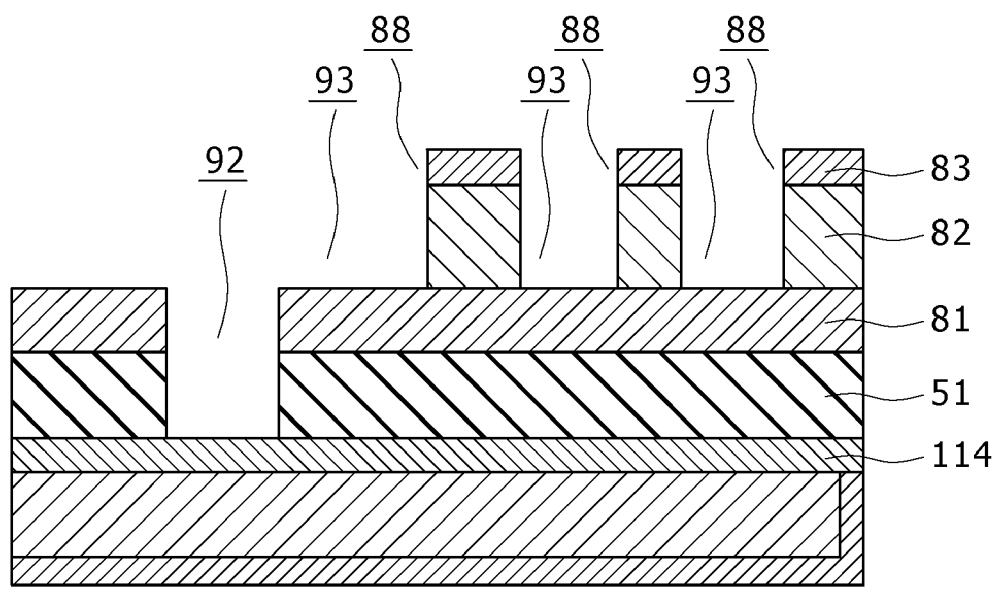
FIGS. 4E and 4F are manufacturing step sectional views illustrating the second embodiment of the method of manufacturing a semiconductor device in the present invention.

Subsequently, as shown in FIG. 4E, the first hard mask 83 is etched using the second hard mask 84 [see FIG. 4D] as an etching mask, to form the wiring groove pattern 88 in an extending manner. The inorganic insulating film 82 at bottom parts of the wiring groove pattern 88 and the first insulation film 51 at the bottom part of the via hole 92 are simultaneously etched. Since these films are both composed of an inorganic silicon oxide based insulating film, they can be etched simultaneously. This etching is carried out by dry etching in which a carbon fluoride (CF) based gas is used.

In this manner, wiring grooves 93 are formed in the inorganic insulating film 82 and the organic insulating film 81, and a via hole 92 is formed in the first insulation film 51 in an extended manner. In this etching process, the etching for forming the via hole 92 is stopped at the upper surface of the barrier insulating film 114, whereas the etching for forming the wiring grooves 93 is stopped at the upper surface of the organic insulating film 81.

Figure 4F:
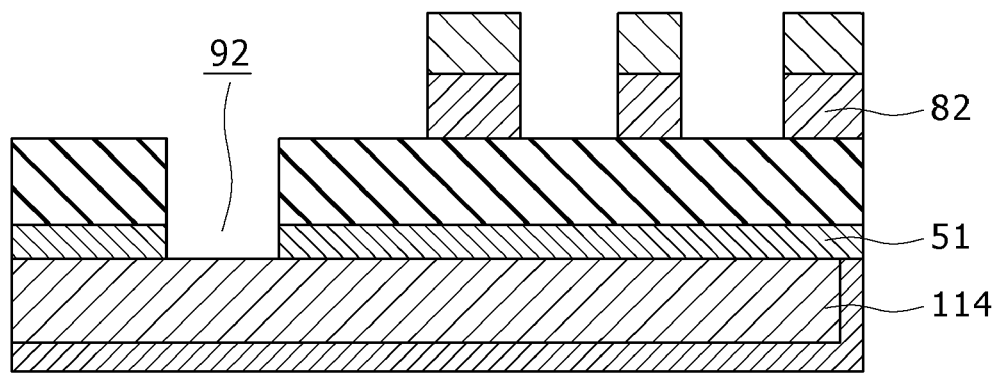

Next, as shown in FIG. 4F, for establishing conductivity in the via hole 92, the barrier insulating film 114 at the bottom part of the via hole 92 is first etched away. In this etching, a mixture of nitrogen ($N_2$) and oxygen ($O_2$) was used as the etching gas. Since this etching does not etch inorganic oxide films, the first insulation film 51 and the inorganic insulating film 82 which are composed of the inorganic oxide films are not etched in this etching. Besides, in this etching, the first hard mask 83 [see FIG. 4E] is also removed.

Figure 4G:
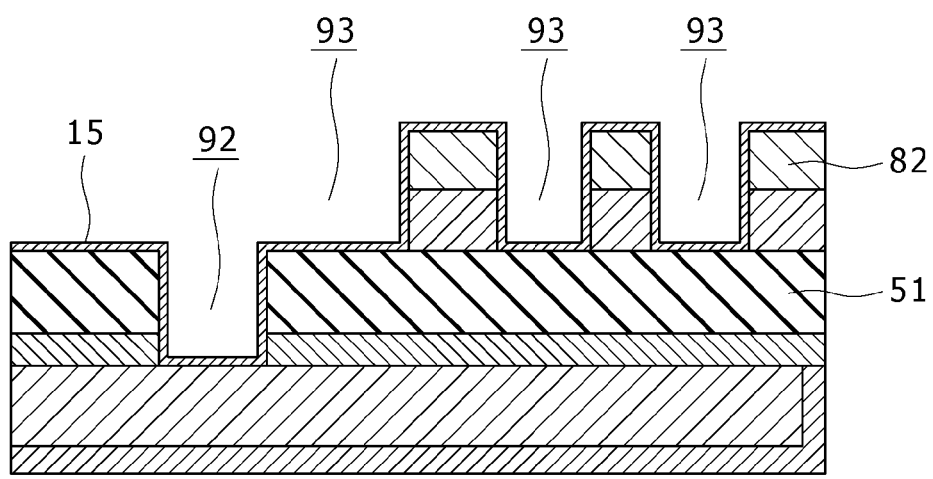
FIGS. 4G and 4H are manufacturing step sectional views illustrating the second embodiment of the method of manufacturing a semiconductor device in the present invention.

Subsequently, as shown in FIG. 4G, a seal layer 15 composed, for example, of a silicon carbide (SiC) film is formed in a thickness of, for example, 0.5 nm on the inorganic insulating film 82 inclusive of the inside surfaces of the via hole 92 and the wiring grooves 93, by using dimethylphenylsilane (DMPS) as a precursor. Since DMPS has a comparatively high molecular weight and a three-dimensional structure, DMPS is comparatively high in controllability of low deposition rate, which is indispensable to formation of an extremely thin film, so that DMPS is suitable for formation of an extremely thin film of about 0.5 nm in thickness. In this case, the film formation was carried out under the conditions of a substrate bias power of 150 W, a film forming atmosphere pressure of 0.67 kPa, a flow rate of DMPS as precursor of 500 cm$^3$/min, a flow rate of helium (He) as carrier gas of 1000 cm$^3$/min, and a substrate temperature of 350° C., but these conditions are not limitative. In addition, the thickness of the seal layer 15 is such that the etching damages generated in the insulation film 51 can be compensated for and that the rise in the via resistance due to the seal layer 15 will not matter; thus, the thickness of the seal layer 15 is desirably not more than 0.5 nm.

Further, electron beam curing (EB-cure) is performed. In this case, irradiation with electron beams was conducted for 5 min under the conditions of a treating atmosphere pressure of 0.93 kPa, a current of 1 mA, and an acceleration voltage of 10 keV, but these conditions are not limitative. By this treatment, enhancement of denseness of the seal layer 15, improvement of adhesion between the seal layer 15 and the insulation film 51, and recovery of the damaged layer (not shown) generated in the insulation film 51 which is a low-k film, were accelerated. Alternatively, an ultraviolet ray curing (UV-cure) treatment may be carried out, whereby the same effect as that of the EB-cure can be obtained. In the case of the UV-cure, irradiation with UV rays having a wavelength of 150 to 380 nm was carried out under the conditions of a substrate temperature of 350° C., an irradiation atmosphere being an inactive atmosphere such as a vacuum atmosphere, an argon (Ar) atmosphere, a helium (He) atmosphere, a nitrogen ($N_2$) atmosphere, etc., an irradiation atmosphere pressure of 0.67 kPa, and an irradiation time of 10 min.

Figure 4H:
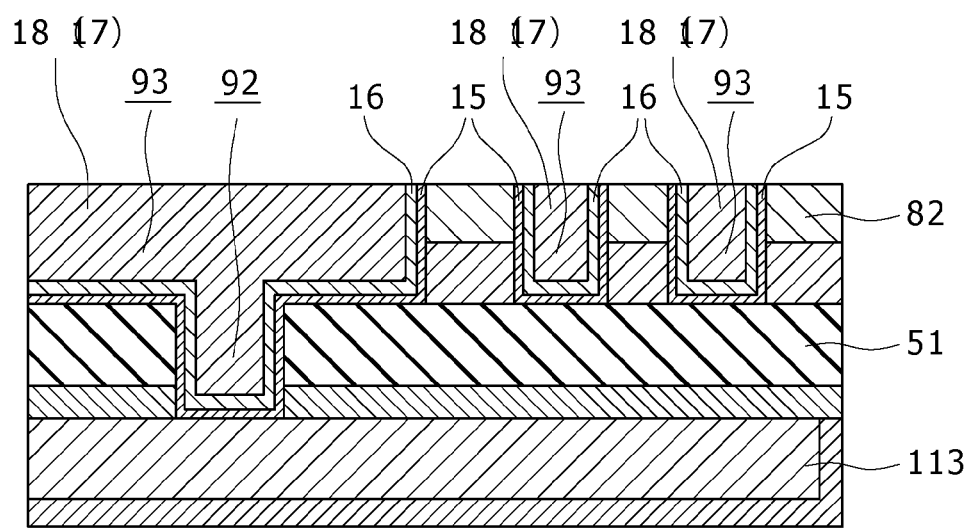

Next, as shown in FIG. 4H, a tantalum (Ta) film as a barrier layer 16 is formed in a thickness of 7 nm over the surface of the inorganic insulating film 82 inclusive of the inside surfaces of the via hole 92 and the wiring grooves 93, with the seal layer 15 therebetween, by a sputtering method. Further, a copper seed layer (not shown) is formed in a thickness of 45 nm. Subsequently, the inside of the via hole 92 and the wiring grooves 93 is filled up with a conductor 17, for example, a copper (Cu) film, by an electrochemical plating (ECP) method or a CVD method. Next, an annealing treatment for effecting grain growth is conducted at 250° C. for 90 sec. Subsequently, the surplus copper (Cu) film 17 (inclusive of the copper seed layer) on the inorganic insulating film 82 is polished away by a chemical mechanical polishing (CMP) method, to complete copper wirings 18 in which the inside of the via hole 92 and the wiring grooves 93 is filled up with the copper film 17, with the seal layer 15 and the barrier film 16 therebetween, and which are connected to the wiring 113 through the via hole 13.

Also in the second embodiment, like in the first embodiment above, a gas based on a silane having an alkyl group is preferably used as a precursor in forming the seal layer 15. Examples of the alkylsilane-based gas which can be used as the precursor include not only the above-mentioned dimethylphenylsilane (DMPS) but also trimethylsilane (3MS), tetramethylsilane (4MS), hexamethyldisilane (HMDS), octamethylcyclotetrasiloxane (OMCTS), tetremethylcyclotetrasiloxane (TMCTS), diethoxymethylsilane (DEMS), and dimethyldimethoxysilane (DMDMOS).

Besides, a carbon-based gas such as methane ($CH_4$) and ethylene ($C_2H_4$) may be added to the alkylsilane-based gas. When the carbon-based gas is thus added, recovery of dangling bonds is accelerated by carbon or a carbon-containing group (e.g., alkyl group).

Figure 5:
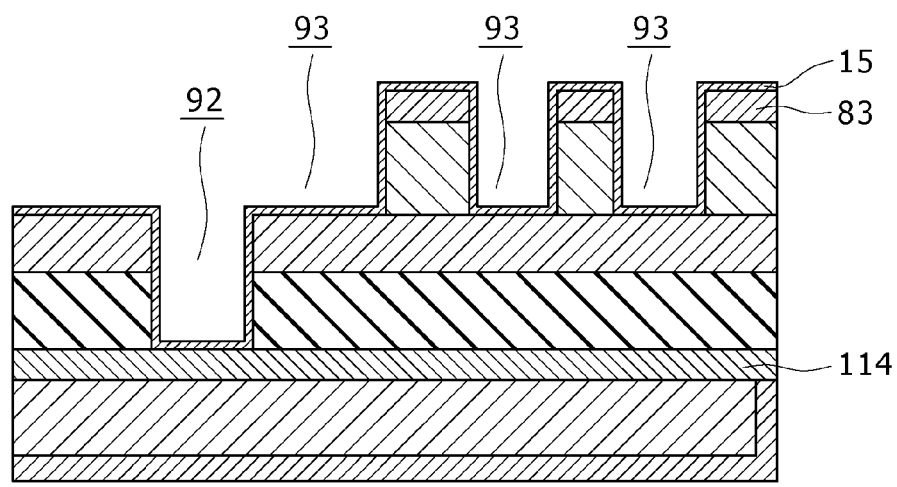
FIG. 5 is a manufacturing step sectional view illustrating a modified example of the second embodiment.
Figure 6A:
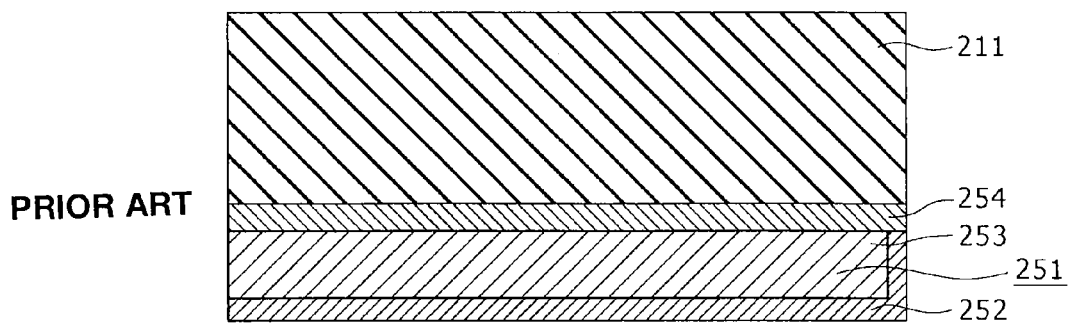
FIGS. 6A to 6C are manufacturing step sectional views illustrating an example of a method of manufacturing a semiconductor device in the related art.
Figure 6B:
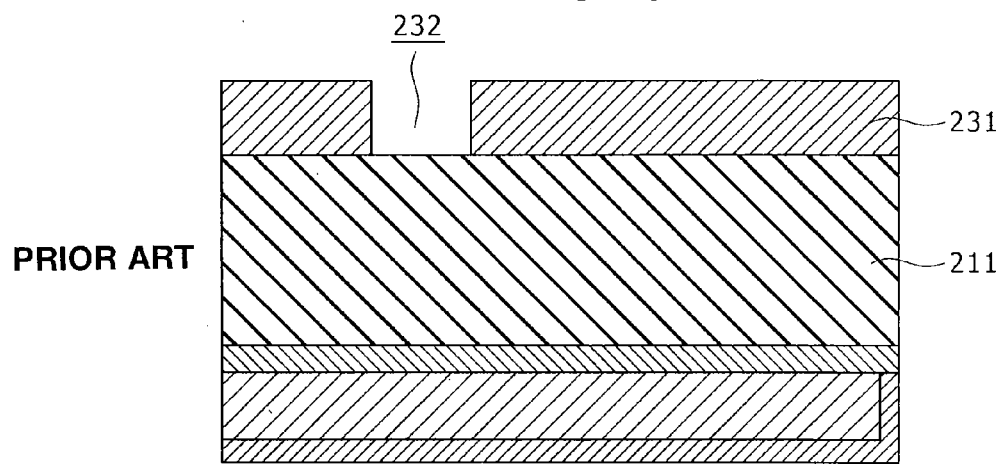
Figure 6C:
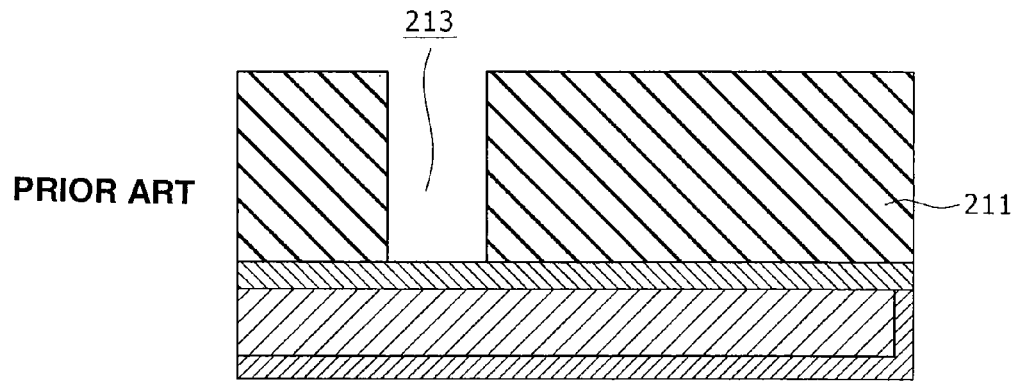
Figure 6D:
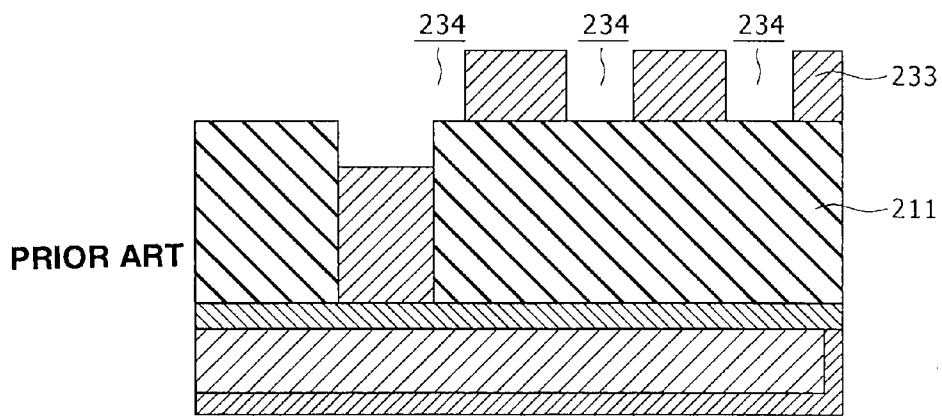
FIGS. 6D to 6F are manufacturing step sectional views illustrating the example of the method of manufacturing a semiconductor device in the related art.
Figure 6E:
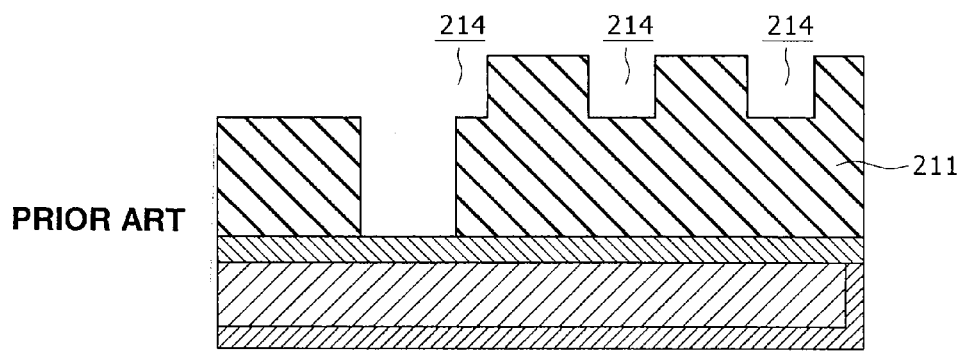
Figure 6F:
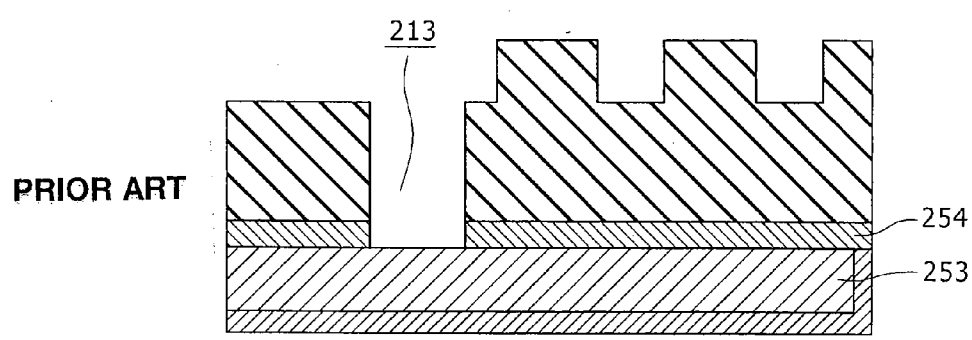
Figure 6G:
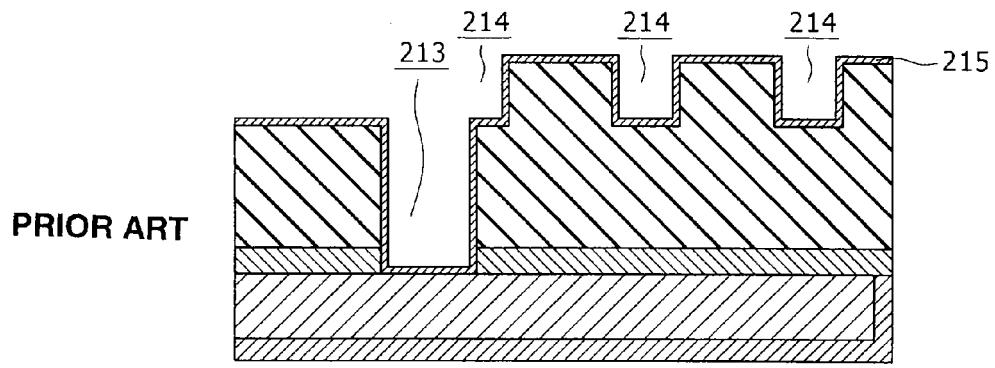
FIGS. 6G to 6I are manufacturing step sectional views illustrating the example of the method of manufacturing a semiconductor device in the related art.
Figure 6H:
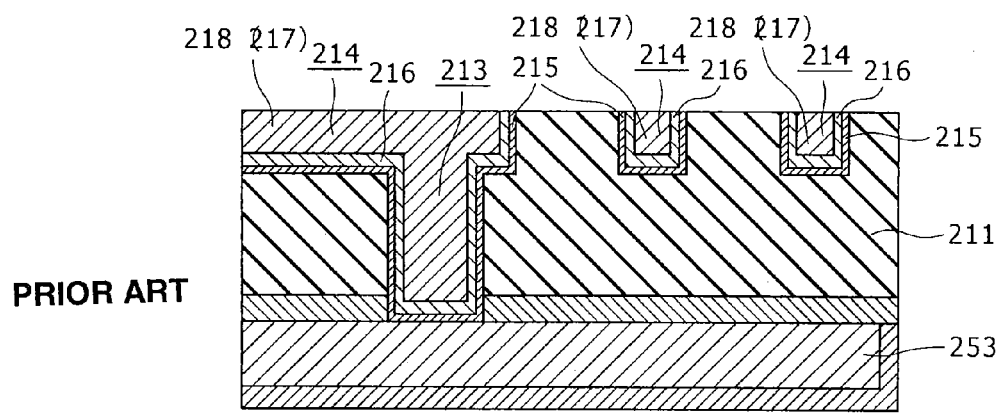
Figure 6I:
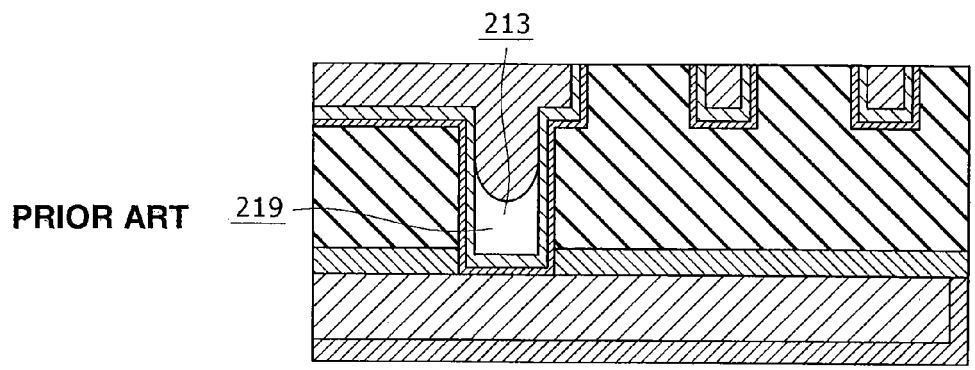

In addition, in the manufacturing method according to the second embodiment, the steps of forming the seal layer 15 and performing the EB-cure or UV-cure may be conducted immediately before the removal of the barrier layer 114 from the inside of the via hole 92, as illustrated in FIG. 5. In this case, the seal layer 15 is formed on the inside surfaces of the via hole 92 and the wiring grooves 93 and on the surface of the first hard mask 83. The conditions for forming the seal layer 15 are the same as the above-mentioned conditions. Thereafter, EB-cure or UV-cure is performed.

Besides, the steps described referring to FIGS. 4G and 4H may be incorporated into the manufacturing method according to the second embodiment. When the steps of forming the seal layer 15 and performing the EB-cure or UV-cure immediately before the removal of the barrier layer 114 from the inside of the via hole 92 and the steps of forming the seal layer 15 and performing the EB-cure or UV-cure immediately after the removal of the barrier layer 114 from the inside of the via hole 92 are thus carried out in combination, the improving effect is further enhanced.

The steps of forming the seal layer 15 and performing the EB-cure or UV-cure can be conducted once or a plurality of times either immediately before the removal of the barrier layer 114 from the inside of the via hole 13 or immediately after the removal of the barrier layer 114 from the inside of the via hole 13. In this case, in order to suppress the rise in the via resistance due to the increase in the total thickness of the seal layer 15 at the bottom part of the via hole 13, the thickness of the seal layer 15 is desirably not more than 0.5 nm, for example.

In the manufacturing method according to the second embodiment, the seal layer 15 is subjected to the EB-cure or UV-cure, like in the first embodiment. Therefore, the number of silicon-oxygen-silicon (Si—O—Si) linkage components is increased as compared with the crosslinking reaction, so that the adhesion between the seal layer 15 and the insulation film 51 is enhanced even though the insulation film 11 is a low-k film. In addition, recovery of the silicon (Si) dangling bonds in the insulation film 51 by carbon or alkyl groups (methyl group is shown as an example in the figure) is accelerated. Further, the recombination accelerates the enhancement of denseness of the film.

Thus, enhancement of denseness of the seal layer 15, improvement of the adhesion between the seal layer 15 and the insulation film 51, and recovery of the damaged layers generate in the insulation film 51 are realized, so that the sealing performance of the seal layer 15 can be enhanced. Therefore, even in the case where the seal layer 15 is formed as an extremely thin film, for example a 0.5 nm-thick film, such that the rise in resistance at the bottom part of the via hole 92 will not matter, the barrier layer 16 formed in the recess (via hole 92) in the insulation film 51 is restrained from being deteriorated in film quality (for example, being oxidized) due to oozing of moisture present in the insulation film 11. In addition, oozing of copper used as a wiring material into the insulation film 51 and via defects (e.g., such defects as stress migration and electro-migration) arising, for example, from deterioration of adhesion between the copper seed layer and the insulation film 51 due to the via can be obviated, which promises enhanced reliability. Besides, the via resistance is made comparable to that in the case of not forming the seal layer, since it is possible, due to the enhancement of denseness of the seal layer 15, to use an extremely thin seal layer 15 of not more than 0.5 nm in thickness. Furthermore, any deterioration in wiring-to-wiring capacity or yield in relation to the via formation was not recognized. Therefore, the via resistance can be lowered while maintaining the sealing performance of the seal layer 15.

Incidentally, laser annealing can be used in place of the EB-cure or UV-cure carried out in the first and second embodiments. For example, by using KrF, XeCl, XeF, ArF or the like as a laser source, the laser annealing may be carried out under the conditions of a substrate temperature of, for example, 350° C., a laser beam irradiation time of, for example, 50 min, an irradiation atmosphere pressure of, for example, 0.67 kPa, and an irradiation atmosphere being an inert atmosphere such as a vacuum atmosphere, an argon atmosphere, a helium atmosphere, a nitrogen atmosphere, etc.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising the steps of:
    forming an insulation film on a conductive layer that includes a barrier layer on at least the upper surface of said conductive layer;
    forming a recess in a insulation film;
    forming a seal layer on inside surfaces of said recess using a silane based gas having an alkyl group as a precursor and a carbon-containing gas;
    applying electron beam cure (EB-cure) or ultra violet cure (UV-cure) to said seal layer; and
    filling up said recess with a conductor.

2. The method of manufacturing the semiconductor device as set forth in claim 1 further comprising the steps of:
    forming said recess such that the bottom of said barrier layer is exposed at the bottom part of said recess; and
    removing the exposed portion of said barrier layer such that the insulation layer is exposed;
    wherein,
        the steps of forming said seal layer on inside surfaces of said recess and the exposed surface of insulation film and applying EB-cure or UV-cure to said seal layer are conducted (a) after the formation of said recess and before said step of filling up said recess with said conductor, (b) immediately before the removal of said barrier layer exposed at said bottom part of said recess, or (c) immediately after the removal of said barrier layer.

3. A method of manufacturing a semiconductor comprising the steps of:

forming an insulation film on a conductive layer that includes a barrier layer on at least the upper surface of said conductive layer forming a recess in a insulation film such that the bottom of said barrier layer is exposed at the bottom part of said recess;

removing the exposed portion of said barrier layer such that the insulation layer is exposed;

forming a seal layer on inside surfaces of said recess and the exposed surface of insulation film using a silane based gas having an alkyl group as a precursor and a carbon-containing gas;

applying electron beam cure (EB-cure) or ultra violet cure (UV-cure) to said seal layer; and filling up said recess with a conductor;

wherein, the steps of forming said seal layer on inside surfaces of said recess and applying EB-cure or UV-cure to said seal layer are carried out more than once and conducted at one or more of the following times: (a) after the formation of said recess and before said step of filling up said recess with said conductor, (b) immediately before the removal of said barrier layer exposed at said bottom part of said recess, and (c) immediately after the removal of said barrier layer.

* * * * *